(12) United States Patent
Hiraku

(10) Patent No.: US 7,924,071 B2
(45) Date of Patent: Apr. 12, 2011

(54) SYNCHRONIZATION DETECTION CIRCUIT, PULSE WIDTH MODULATION CIRCUIT USING THE SAME, AND SYNCHRONIZATION DETECTION METHOD

(75) Inventor: Yasuyuki Hiraku, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 33 days.

(21) Appl. No.: 12/585,340

(22) Filed: Sep. 11, 2009

(65) Prior Publication Data

US 2010/0066425 A1   Mar. 18, 2010

(30) Foreign Application Priority Data

Sep. 16, 2008   (JP) ................... 2008-235840

(51) Int. Cl.
*H03L 7/00*   (2006.01)
(52) U.S. Cl. ...................... 327/144; 327/145
(58) Field of Classification Search .................. 327/141, 327/144, 145
See application file for complete search history.

(56) References Cited

U.S. PATENT DOCUMENTS

| | | | | |
|---|---|---|---|---|
| 6,737,896 B2 * | 5/2004 | Yoshioka | ...................... | 327/144 |
| 7,088,155 B2 * | 8/2006 | Takahashi | ...................... | 327/144 |
| 7,554,373 B2 | 6/2009 | Fujino et al. | | |
| 7,683,690 B2 * | 3/2010 | Hiraku | ...................... | 327/291 |
| 2008/0055697 A1 | 3/2008 | Okazaki | | |

FOREIGN PATENT DOCUMENTS

| | | |
|---|---|---|
| JP | 2006-20109 | 1/2006 |
| JP | 2008-55750 | 3/2008 |

* cited by examiner

*Primary Examiner* — Hai L Nguyen
(74) *Attorney, Agent, or Firm* — McGinn IP Law Group, PLLC

(57) ABSTRACT

Provided is a synchronization detection circuit including: a multiphase clock generation circuit which includes a phase locked loop circuit that generates multiphase clock signals having a plurality of different phases, based on a reference clock signal, and which generates high-speed multiphase clock signals having a frequency obtained by multiplying a frequency of the reference clock signal, and low-speed multiphase clock signals having a frequency obtained by dividing a frequency of the high-speed multiphase clock signal; and a synchronous clock specifying circuit that specifies a clock signal synchronized with a synchronous signal from among the multiphase clock signals, and generates a synchronous position signal indicating a synchronous position of the synchronous signal, based on a comparison result between the synchronous signal and the high-speed multiphase clock signals and a comparison result between the synchronous signal and representative clock signals selected from the low-speed multiphase clock signals.

8 Claims, 14 Drawing Sheets

SYNCHRONIZATION DETECTION CIRCUIT, PULSE WIDTH MODULATION CIRCUIT USING THE SAME, AND SYNCHRONIZATION DETECTION METHOD

BACKGROUND

1. Field of the Invention

The present invention relates to synchronization detection using multiphase clock signals.

2. Description of Related Art

Currently, control operation using a synchronous signal is performed in various electrical devices. For example, the synchronous signal is used for control of print tone in laser beam printers, digital copiers, and the like. To achieve the control operation, there is employed a synchronization detection circuit for detecting the input timing of the synchronous signal using multiphase clock signals. The synchronization detection circuit is basically configured to compare a pulse edge of the synchronous signal with a pulse edge of each of clock signals constituting the multiphase clock signals, thereby specifying a clock signal having a pulse edge closest to that of the synchronous signal from among the multiphase clock signals.

A technology relating to the above-mentioned synchronization detection circuit is disclosed in Japanese Unexamined Patent Application Publication Nos. 2006-20109 and 2008-55750. In the configuration disclosed in Japanese Unexamined Patent Application Publication No. 2006-20109, an intermediate clock signal is generated by a phase locked loop circuit, and phase interpolation processing is then performed on the intermediate clock signal, to thereby generate multiphase clock signals based on the reference clock signal. In this manner, the multiphase clock signals are generated using the phase locked loop circuit as well as a phase interpolation circuit, thereby preventing a reduction in processing speed which is caused when only the phase locked loop circuit is used, and also prevent a reduction in detection accuracy which is caused when only the phase interpolation circuit is used.

In the configuration disclosed in Japanese Unexamined Patent Application Publication No. 2008-55750, a synchronous signal is compared with speeded-up multiphase clock signals having a frequency which is k times as high as that of the reference clock signal. Then, the number of time that a representative clock signal selected from the speeded-up multiphase clock signals, e.g., the head clock signal in the multiphase clock signals appeared is counted. By this counting, a cycle of the multiphase clock signals is specified. The speeded-up multiphase clock signals have a phase shift interval smaller than that obtained before speeding up the multiphase clock signals, and thus have a higher resolution. Accordingly, the use of the speeded-up multiphase clock signals makes it possible to perform the synchronization detection with high accuracy.

SUMMARY

The present inventor has found a problem in the configuration disclosed in Japanese Unexamined Patent Application Publication No. 2006-20109 that the number of flip-flops (hereinafter abbreviated as "FF(s)") for use in obtaining the comparison result between the synchronous signal and the multiphase clock signals, and the number of inputs of an encoder for converting the outputs of the FFs into signals having a predetermined bit width increase along with an increase in the number of phases of the clock signal. Accordingly, the above-mentioned configuration is susceptible to improvement in the number of components, processing speed, and the like. For example, when 256-phase multiphase clock signals are used, 256 FFs are required for detecting the synchronous position, and the encoder needs to have 256 inputs (see FIG. 8. of Japanese Unexamined Patent Application Publication No. 2006-20109). The increase in the number of FFs causes an increase in chip area and costs, and the increase in the number of inputs of the encoder causes a reduction in processing speed.

Furthermore, as described above, Japanese Unexamined Patent Application Publication No. 2008-55750 adopts the configuration in which the number of time that the representative clock signal selected from the multiphase clock signals appeared is counted in order to specify the cycle of the speeded-up multiphase clock signals. In this configuration that it may take a long time to count up the pulses, and the processing speed may be drastically reduced.

To solve the above-mentioned problem, a first exemplary aspect of the present invention is a synchronization detection circuit including: a multiphase clock generation circuit which includes a phase locked loop circuit that generates multiphase clock signals having a plurality of different phases, based on a reference clock signal, and which generates high-speed multiphase clock signals having a frequency obtained by multiplying a frequency of the reference clock signal, and low-speed multiphase clock signals having a frequency obtained by dividing a frequency of the high-speed multiphase clock signals; and a synchronous clock specifying circuit that specifies a clock signal synchronized with a synchronous signal from among the multiphase clock signals, and generates a synchronous position signal indicating a synchronous position of the synchronous signal, based on a comparison result between the synchronous signal and the high-speed multiphase clock signals and a comparison result between the synchronous signal and representative clock signals selected from the low-speed multiphase clock signals.

In the above-mentioned configuration, the synchronous position signal is generated based on the comparison result between the synchronous signal and the high-speed multiphase clock signals and the comparison result between the synchronous signal and the representative clock signals. To generate the synchronous position signal, it is necessary to specify the cycle of the high-speed multiphase clock signals synchronized with the synchronous signal. The cycle is specified based on the comparison result between the synchronous signal and the representative clock signals.

A second exemplary aspect of the present invention is a pulse width modulation circuit which includes a synchronization detection circuit having the above-mentioned configuration as a basic configuration, and which outputs a pulse width modulation signal based on multiphase clock signals generated by the multiphase clock generation circuit, a synchronous position signal generated by the synchronous clock specifying circuit, and digital pulse data.

Thus, it is possible to provide a pulse width modulation circuit utilizing operations and effects of the synchronization detection circuit.

A third aspect of the present invention is a synchronization detection method including: generating high-speed multiphase clock signals synchronized in phase with a reference clock signal, having a frequency obtained by multiplying a frequency of the reference clock signal, and having a plurality of different phases; generating low-speed multiphase clock signals synchronized in phase with the reference clock signal, having a frequency obtained by dividing a frequency of the high-speed multiphase clock signals, and having a plurality of different phases; selecting a representative clock signal capable of specifying a cycle of each of the high-speed multiphase clock signals from among the low-speed multiphase clock signals; comparing a synchronous signal with the high-speed multiphase clock signals; comparing the synchronous signal with the representative clock signal; and generating a synchronous position signal for specifying a synchronous position of the synchronous signal based on a comparison result between the synchronous signal and the high-speed multiphase clock signals and a comparison result between the synchronous signal and the representative clock signal.

The synchronization detection method is based on a technical idea similar to that of the synchronization detection circuit.

According to an exemplary embodiment of the present invention, the necessity of comparing the synchronous signal with all the multiphase clock signals is eliminated, which results in a reduction in the number of components such as flip-flops. Further, high-speed multiphase clock signals having a high resolution are used for the detection of the synchronous position, thereby ensuring the high detection accuracy. Furthermore, the cycle of each of the high-speed multiphase clock signals is specified based on the comparison result between the synchronous signal and the representative clock signal, thereby preventing a reduction in processing speed.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
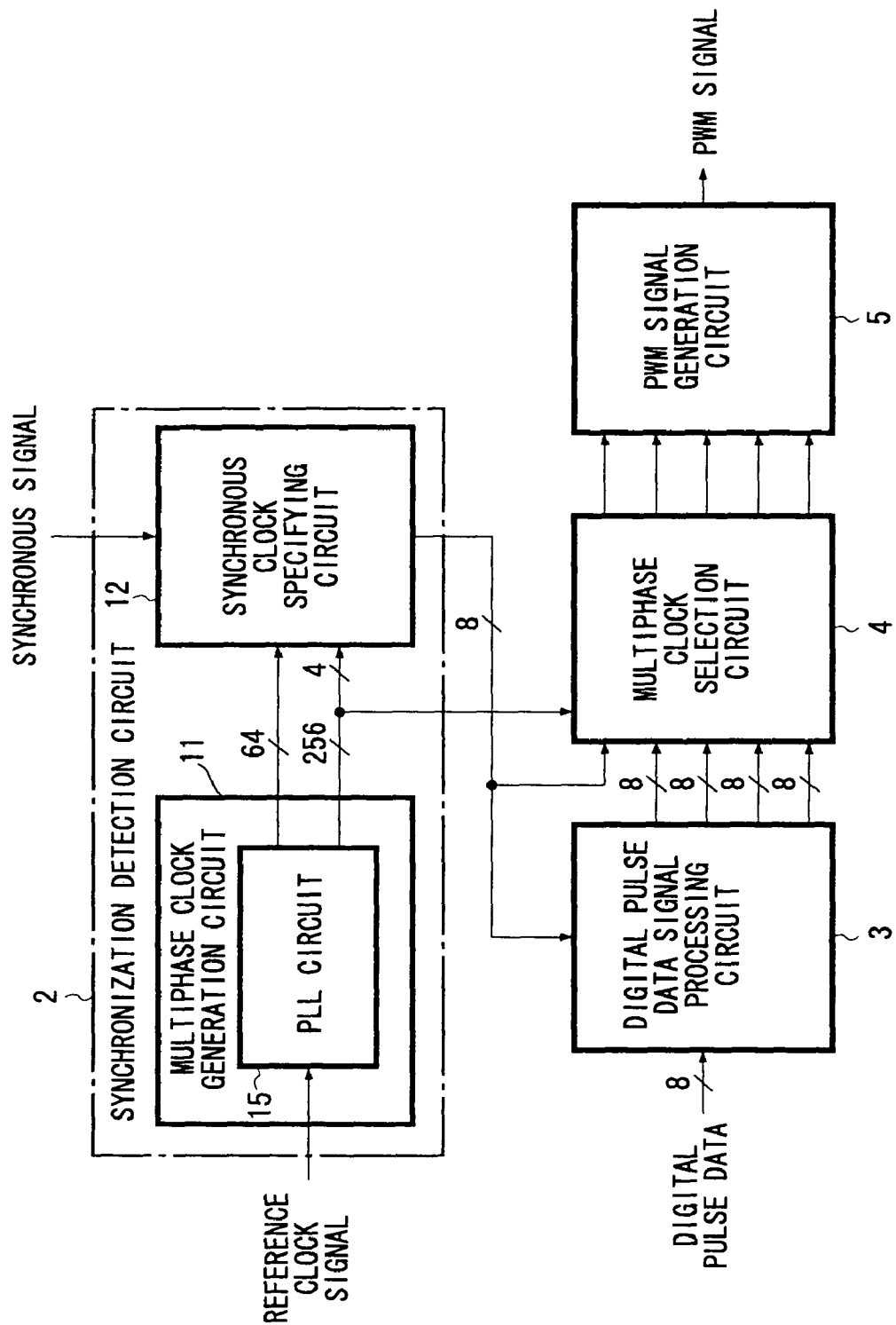
FIG. 1 is a diagram showing the configuration of a pulse width modulation circuit according to a first exemplary embodiment of the present invention.

FIG. 1 is a block diagram showing the configuration of a pulse width modulation circuit 1 according to a first exemplary embodiment of the present invention. The pulse width modulation circuit 1 is incorporated in a laser beam printer, for example, and outputs a pulse width modulation (PWM) signal for controlling print tone. The pulse width modulation circuit 1 includes a synchronization detection circuit 2, a digital pulse data signal processing circuit 3, a multiphase clock selection circuit 4, and a PWM signal generation circuit 5.

The synchronization detection circuit 2 includes a multiphase clock generation circuit 11 and a synchronous clock specifying circuit 12, and is configured to detect a synchronous position of a synchronous signal such as a horizontal synchronous signal. To detect the synchronous position, a pulse edge of each of multiphase clock signals generated by the multiphase clock generation circuit 11 is compared with a pulse edge of the synchronous signal, and a clock signal synchronized with the synchronous signal is specified from among the multiphase clock signals. The configuration of the synchronization detection circuit 2 will be described later. A synchronous position signal indicating the synchronous position of the synchronous signal detected by the synchronization detection circuit 2 is output to each of the digital pulse data signal processing circuit 3 and the multiphase clock selection circuit 4.

The digital pulse data signal processing circuit 3 receives digital pulse data, which is input data, and the synchronous position signal. The digital pulse data signal processing circuit 3 converts the digital pulse data into the PWM signal pulse rise information and fall information based on the synchronous position signal, to thereby synchronize the synchronous signal with the PWM signal. The signal containing the rise information and fall information is input to the multiphase clock selection circuit 4.

The multiphase clock selection circuit 4 receives the multiphase clock signals, the synchronous position signal, and the signal containing the rise information and fall information. The multiphase clock selection circuit 4 selects an arbitrary clock signal from the multiphase clock signals according to the rise information and fall information. The clock signal thus selected (hereinafter referred to as "selected clock signal") is input to the PWM signal generation circuit 5.

The PWM signal generation circuit 5 receives the selected clock signal, and generates the PWM signal based on the selected clock signal.

Figure 2:
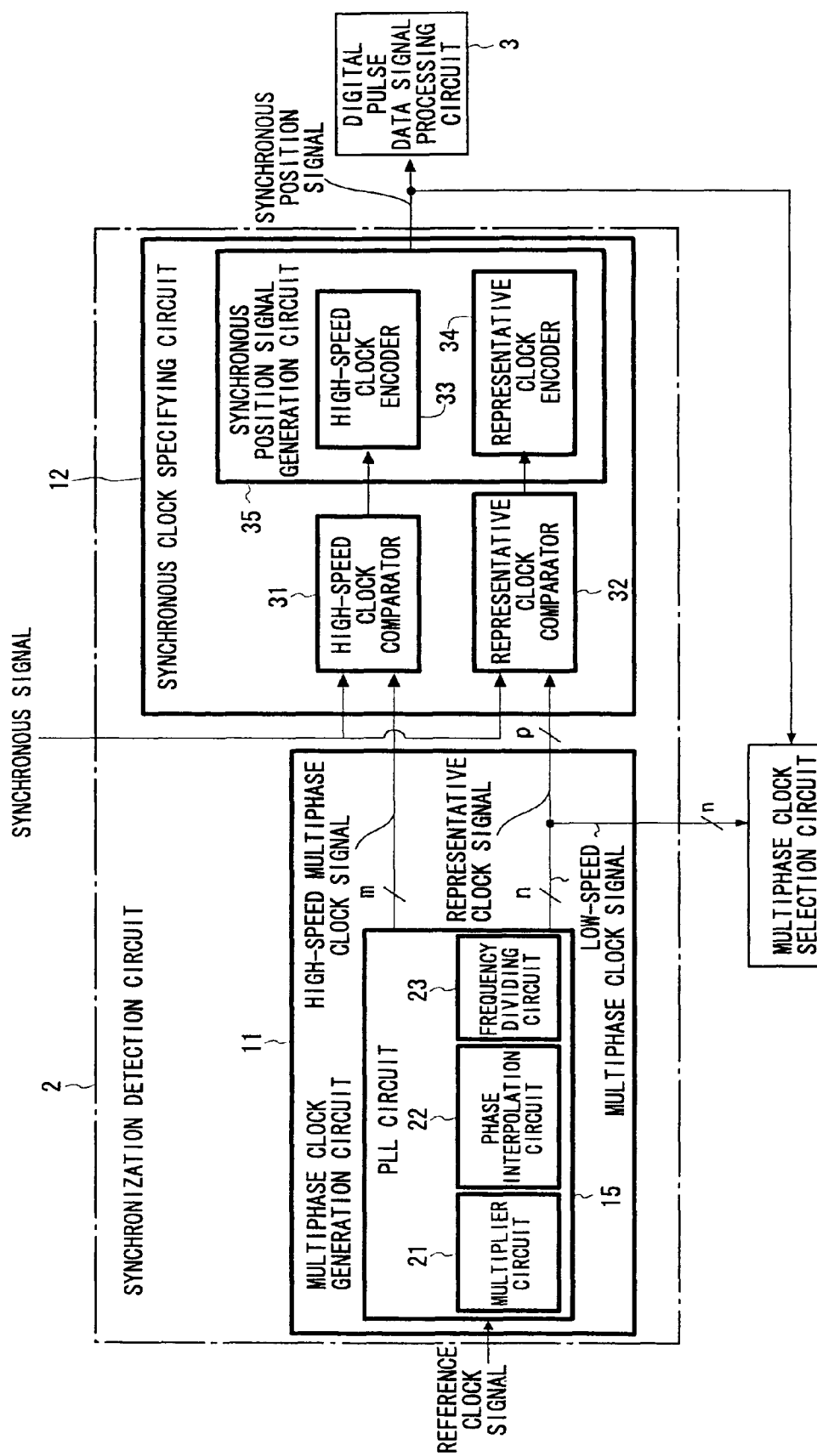
FIG. 2 is a diagram showing the configuration of a synchronization detection circuit according to the first exemplary embodiment of the present invention.

FIG. 2 is a block diagram showing a more detailed configuration of the synchronization detection circuit 2. The synchronization detection circuit 2 includes the multiphase clock generation circuit 11 and the synchronous clock specifying circuit 12.

The multiphase clock generation circuit 11 incorporates a phase locked loop (PLL) circuit 15 to generate high-speed multiphase clock signals and low-speed multiphase clock signals based on a reference clock signal. The PLL circuit 15 includes a multiplier circuit 21, a phase interpolation circuit 22, and a frequency dividing circuit 23. The multiplier circuit 21 multiplies the frequency of the clock signal by h (h is an integer equal to or greater than 2). The phase interpolation circuit 22 outputs a clock signal for performing phase interpolation on a plurality of clock signals. The frequency dividing circuit 23 multiplies the frequency of the clock signal by 1/k (k is an integer equal to or greater than 2).

The high-speed multiphase clock signals are m (m is an integer equal to or greater than 2)-phase multiphase clock signals having different phases and having a frequency obtained by multiplying the frequency of the reference clock signal by h. The high-speed multiphase clock signals are input to a high-speed clock comparator 31 which is described later.

The low-speed multiphase clock signals are n (n is an integer equal to or greater than 2)-phase multiphase clock signals having different phases and having a frequency obtained by dividing the frequency of the high-speed multiphase clock signal by k. The relation n=m*h is preferably satisfied. The low-speed multiphase clock signals are input to the multiphase clock selection circuit 4.

From among the low-speed multiphase clock signals, p (p is an integer equal to or greater than 1)-phase representative clock signals are selected. The representative clock signals are capable of specifying the cycle of the high-speed multiphase clock signals according to a synchronous relationship with the synchronous signal. The representative clock signals are input to a representative clock comparator 32 which is described later.

The synchronous clock specifying circuit 12 generates the synchronous position signal indicating the synchronous position of the synchronous signal, based on a comparison result between the synchronous signal and the high-speed multiphase clock signals and a comparison result between the synchronous signal and the representative clock signals.

The synchronous clock specifying circuit 12 includes the high-speed clock comparator 31, the representative clock comparator 32, a high-speed clock encoder 33, a representative clock encoder 34, and a synchronous position signal generation circuit 35.

The high-speed clock comparator 31 compares the pulse edge of the synchronous signal with the pulse edge of the high-speed multiphase clock signals, and outputs the comparison result.

The representative clock comparator 32 compares the pulse edge of the synchronous signal with the pulse edge of the representative clock signals, and outputs the comparison result.

The high-speed clock encoder 33 generates a high-speed clock specifying signal for specifying a high-speed clock signal synchronized with the synchronous signal, based on the comparison result from the high-speed clock comparator 31. The representative clock signal encoder 34 generates a representative clock specifying signal for specifying a representative clock signal synchronized with the synchronous signal, based on the comparison result from the representative clock signal comparator 32. The synchronous position signal generation circuit 35 generates the synchronous position signal based on the high-speed clock specifying signal and the representative clock specifying signal. The synchronous position signal is input to each of the digital pulse data signal processing circuit 3 and the multiphase clock selection circuit 4.

Figure 3A:
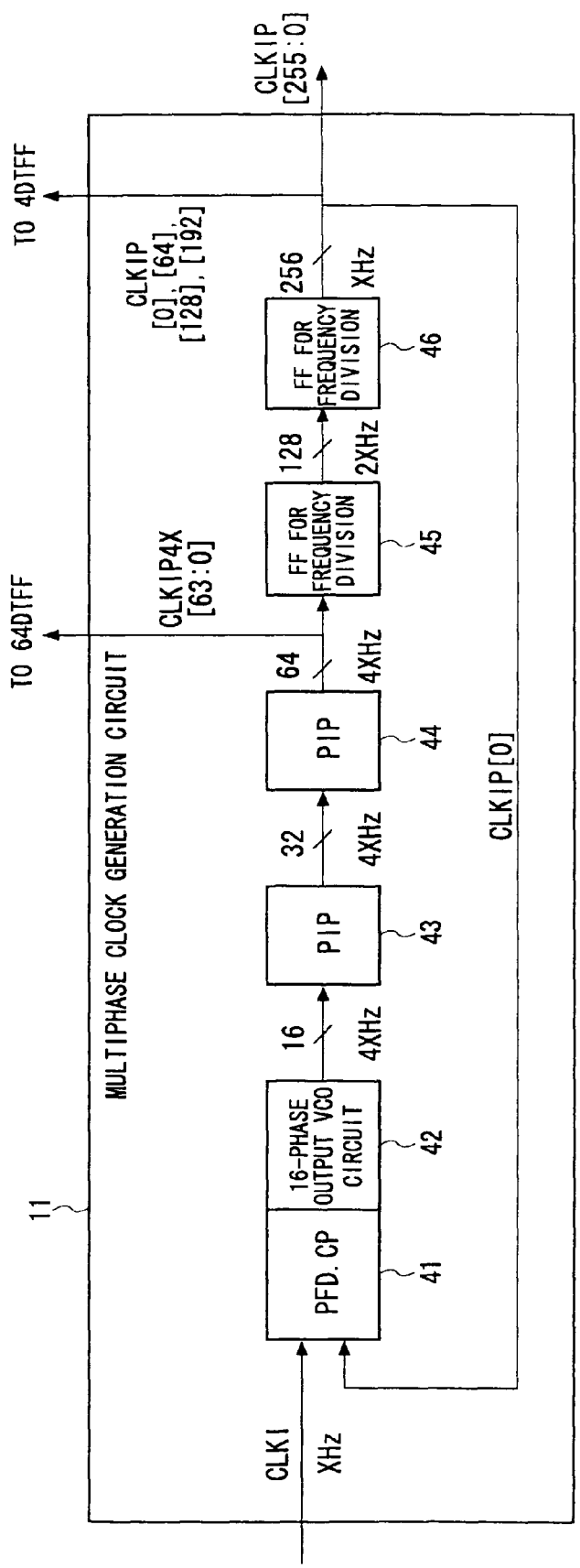
FIG. 3A is a diagram showing the structure of a multiphase clock generation circuit according to the first exemplary embodiment of the present invention.

FIG. 3A is a block diagram showing a specific configuration example of the multiphase clock generation circuit 11. The multiphase clock generation circuit 11 incorporates the PLL circuit including a phase frequency detector/charge pump (PFD. CP) 41, a voltage controlled oscillator (VCO) 42, a first phase interpolator (PIP) 43, a second phase interpolator 44, a first frequency divider (FF) 45, and a second frequency divider 46.

The phase frequency detector/charge pump 41 converts a phase difference between two received clock signals into a voltage, and outputs the voltage. The phase comparator according to this exemplary embodiment compares a reference clock signal CLKI with a feedback clock signal CLKIP [0] to be fed back. In this exemplary embodiment, the feedback clock signal CLKIP[0] is the head clock signal in 256-phase low-speed multiphase clock signals CLKIP[255:0] generated by the PLL circuit.

The voltage controlled oscillator 42 generates a clock signal by multiplying the frequency of the reference clock signal according to the voltage output from the phase comparator to generate a multiphase clock signal from the clock signal, and outputs the multiphase clock signal. The voltage controlled oscillator 42 of this exemplary embodiment multiplies the reference clock signal CLKI by four, and outputs a 16-phase signal.

The first phase interpolator 43 and the second phase interpolator 44 generate a clock signal for performing phase interpolation on two clock signals having different phases (each of the phase interpolators is also called a timing difference division circuit, an interpolator, or the like). The specific configuration of each of the phase interpolators 43 and 44 is disclosed in Japanese Unexamined Patent Application Publication No. 2006-20109, for example. In this exemplary embodiment, the first phase interpolator 43 generates 32-phase clock signals from 16-phase multiphase clock signals output from the voltage controlled oscillator 42. Further, the second phase interpolator 44 generates 64-phase signals from the 32-phase clock signals. The first and second phase interpolators 43 and 44 generate 64-phase high-speed multiphase clock signals CLKIP4X[63:0]. The high-speed multiphase clock signals CLKIP4X[63:0] are input to a 64DTFF 51 of the synchronous clock specifying circuit 12. As described later, the 64DTFF 51 compares the pulse edge of the synchronous signal with the pulse edge of each of the high-speed multiphase clock signals CLKIP4X[63:0], and outputs the comparison result as a binary signal for each of the high-speed clock signals CLKIP4X[0] to [63] that constitute the high-speed multiphase clock signals.

The first frequency divider 45 and the second frequency divider 46 divide the frequency of the input clock signal and output a frequency-divided clock signal. Each of the first and second frequency dividers 45 and 46 includes an FF. In this exemplary embodiment, the frequencies of the high-speed multiphase clock signals CLKIP4X[63:0], which are output from the second phase interpolator 44, are divided by two by the first frequency divider 45, and are further divided by two by the second frequency divider 46.

The low-speed multiphase clock signals CLKIP[255:0] are generated based on the output of the second frequency divider 46. The low-speed multiphase clock signals CLKIP[255:0] are 256-phase clock signals having the same frequency as that of the reference clock signal and having different phases. The low-speed multiphase clock signals CLKIP[255:0] are input to the multiphase clock selection circuit 4, and the head clock signal CLKIP[0] is fed back to the phase frequency detector/charge pump 41 as the feedback clock signal.

Further, representative clock signals are selected from the low-speed multiphase clock signals CLKIP[255:0]. The representative clock signals are capable of specifying the cycle of each of the high-speed multiphase clock signals CLKIP4X [63:0] according to the synchronous relationship with the synchronous signal. In this exemplary embodiment, the clock signals CLKIP[0], CLKIP[64], CLKIP[128], and CLKIP [192] are selected. The representative clock signals CLKIP [0], CLKIP[64], CLKIP[128], and CLKIP[192] are input to a 4DTFF 52 of the synchronous clock specifying circuit 12. As described later, the 4DTFF 52 compares the pulse edge of the synchronous signal with the pulse edge of each of the representative clock signals CLKIP[0], CLKIP[64], CLKIP[128], and CLKIP[192], and outputs the comparison result as a binary signal for each of the representative clock signals.

Figure 3B:
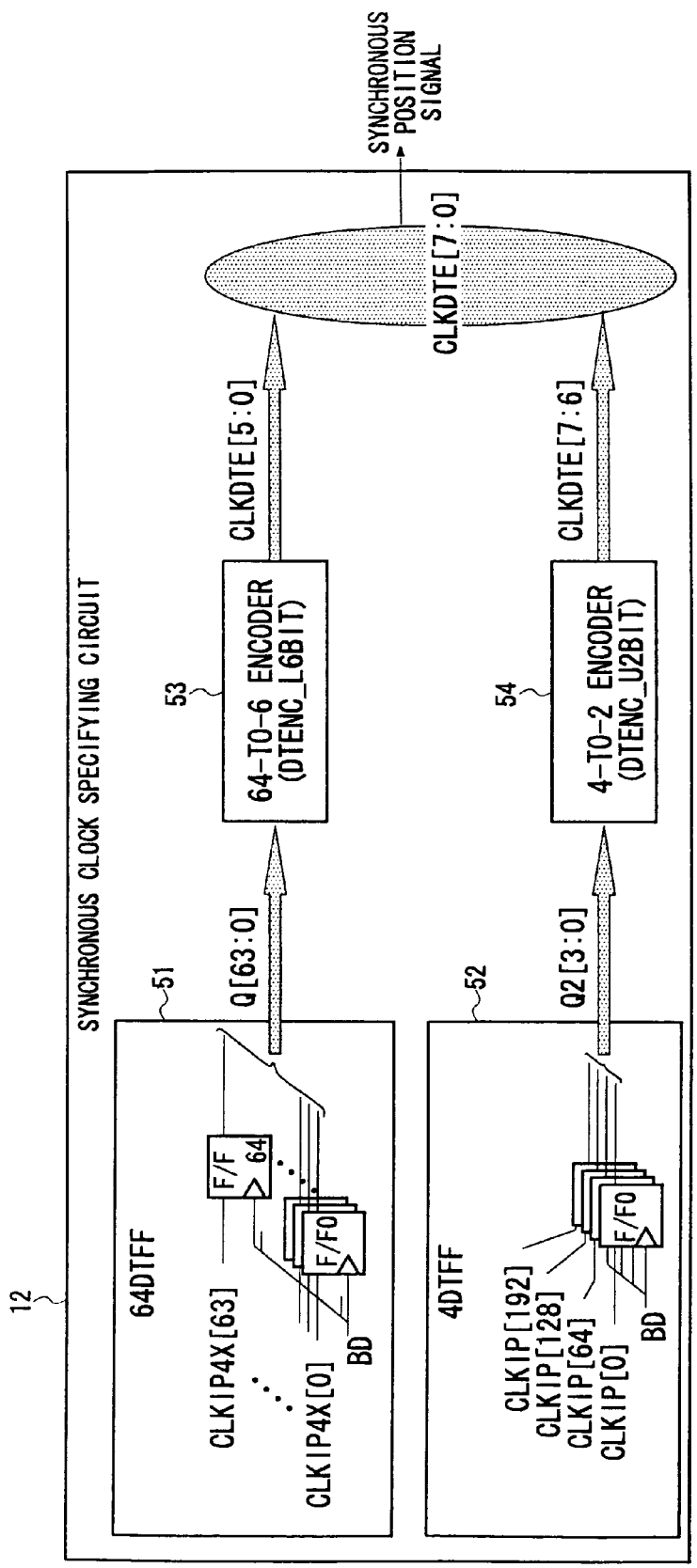
FIG. 3B is a diagram showing the configuration of a synchronous clock specifying circuit according to the first exemplary embodiment of the present invention.

FIG. 3B is a block diagram showing a specific configuration example of the synchronous clock specifying circuit 12. The synchronous clock specifying circuit 12 includes the 64DTFF 51, the 4DTFF 52, a 64-to-6 encoder 53, and a 4-to-2 encoder 54.

The 64DTFF 51 includes 64 FF circuits, the number of which is equal to the number of phases of the high-speed multiphase clock signals CLKIP4X[63:0]. The FF circuits receive the high-speed clock signals CLKIP4X[0] to [63], respectively, and also receive the synchronous signal BD to output a signal Q[63:0] according to a combination of pulse edges of the high-speed clock signal and the synchronous signal.

Figure 4A:
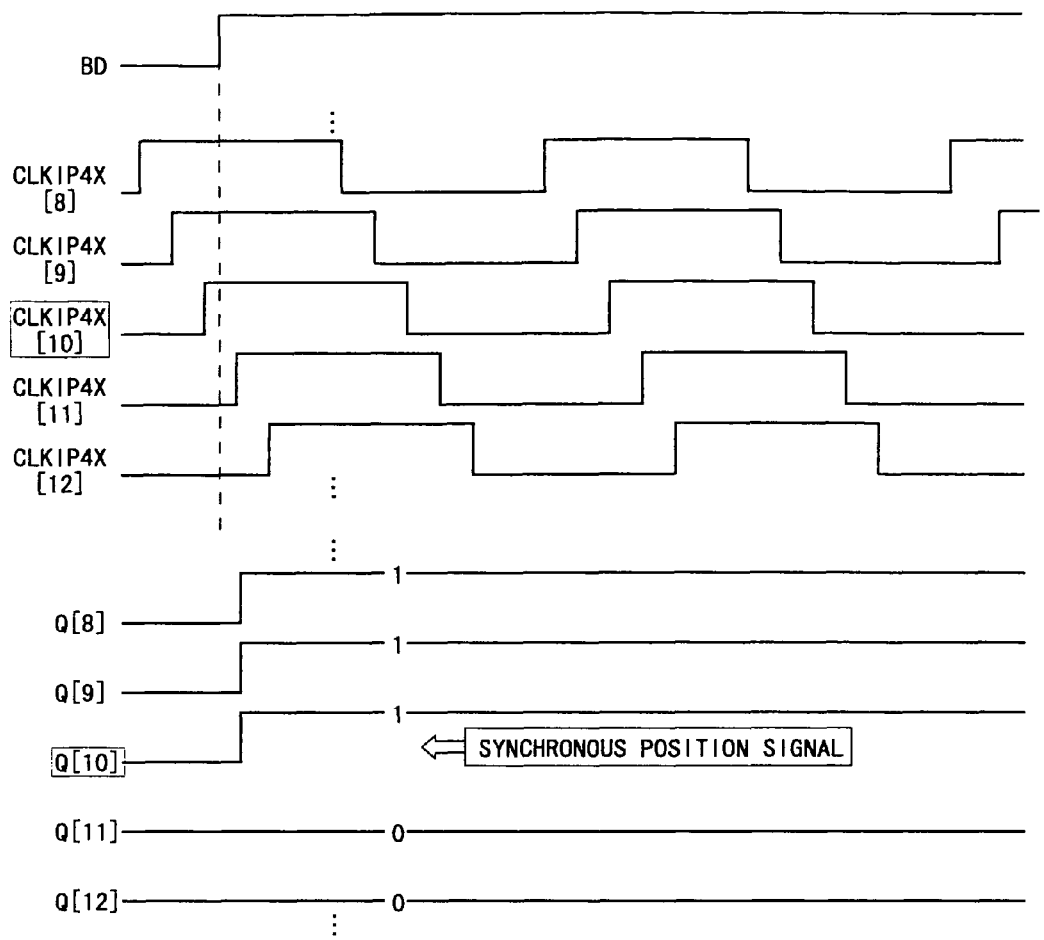
FIG. 4A shows an example of a timing diagram of the first exemplary embodiment.

FIG. 4A is an example of a timing diagram showing the synchronous signal BD, part of the high-speed clock signals CLKIP4X[0] to CLKIP4X[63], and part of output signals Q[0] to Q[63] from the FF circuits. The FF circuits of this exemplary embodiment are logically designed so that the output signals Q[0] to Q[63] indicate "1", when the input value of each of the synchronous signal BD and the high-speed clock signals CLKIP4X[0] to CLKIP4X[63] is "1(H)". In the timing diagram example, at a rising edge of the synchronous signal BD, the input value of each of the high-speed clock signals CLKIP4X[0] to CLKIP4X[10] is "1", and the input value of each of the clock signals CLKIP4X[11] to CLKIP4X[63] is "0(L)". Accordingly, the output signals Q[0] to Q[10] indicate "1", and the clock signals Q[11] to Q[63] indicate "0". It can be determined from the results that the high-speed clock signal CLKIP4X[10] is synchronized with the synchronous signal BD.

In this case, the high-speed multiphase clock signals have a frequency four times as high as that of the reference clock signal. Accordingly, one cycle of the reference clock signal contains four cycles of the high-speed clock signals CLKIP4X[0] to CLKIP4X[63]. Further, the low-speed multiphase clock signals obtained by dividing one cycle of the reference clock signal into 256 phases are generated by use of four cycles of the 64-phase high-speed multiphase clock signals. Specifically, the high-speed clock signals CLKIP4X[0] to CLKIP4X[63] of a first cycle correspond to the low-speed clock signals CLKIP[0] to CLKIP[63] constituting the low-speed multiphase clock signals, and the high-speed clock signals CLKIP4X[0] to CLKIP4X[63] of a second cycle correspond the low-speed clock signals CLKIP[64] to CLKIP [127]. Further, the high-speed clock signals CLKIP4X[0] to CLKIP4X[63] of a third cycle correspond to the low-speed clock signals CLKIP[128] to CLKIP[191], and the high-speed clock signals CLKIP4X[0] to CLKIP4X[63] of a fourth cycle correspond to the low-speed clock signals CLKIP[192] to CLKIP[255].

Figure 4B:
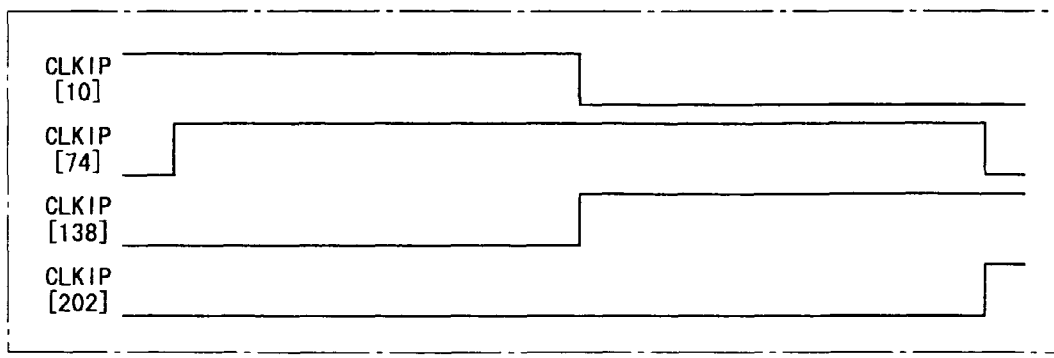
FIG. 4B is a diagram showing candidates for a synchronous position assumed based on the example shown in FIG. 4A.

Thus, as shown in the timing diagram example, when the high-speed clock signal synchronized with the synchronous signal BD corresponds to the high-speed clock signal CLKIP4X[10], four clock signals CLKIP[10], CLKIP[74], CLKIP[138], and CLKIP[202] shown in FIG. 4B are illustrated as candidates for the low-speed multiphase clock signal synchronized with the synchronous signal BD. The four candidates can be narrowed down to one according to the synchronous relationship between the synchronous signal BD and the representative clock signals CLKIP[0], CLKIP[64], CLKIP[128], and CLKIP[192].

The synchronous relationship between the synchronous signal BD and the representative clock signals CLKIP[0], CLKIP[64], CLKIP[128], and CLKIP[192] is determined by the 4DTFF 52 (see FIG. 3B). The 4DTFF 52 includes four FF circuits, the number of which is equal to the number of the representative clock signals CLKIP[0], [64], [128], and [192]. The FF circuits receive the representative clock signals CLKIP[0], CLKIP[64], CLKIP[128], and CLKIP[192], respectively, and also receive the synchronous signal BD to output a signal Q2[3:0] according to a combination of pulse edges of the representative clock signal and the synchronous signal.

Figure 5:
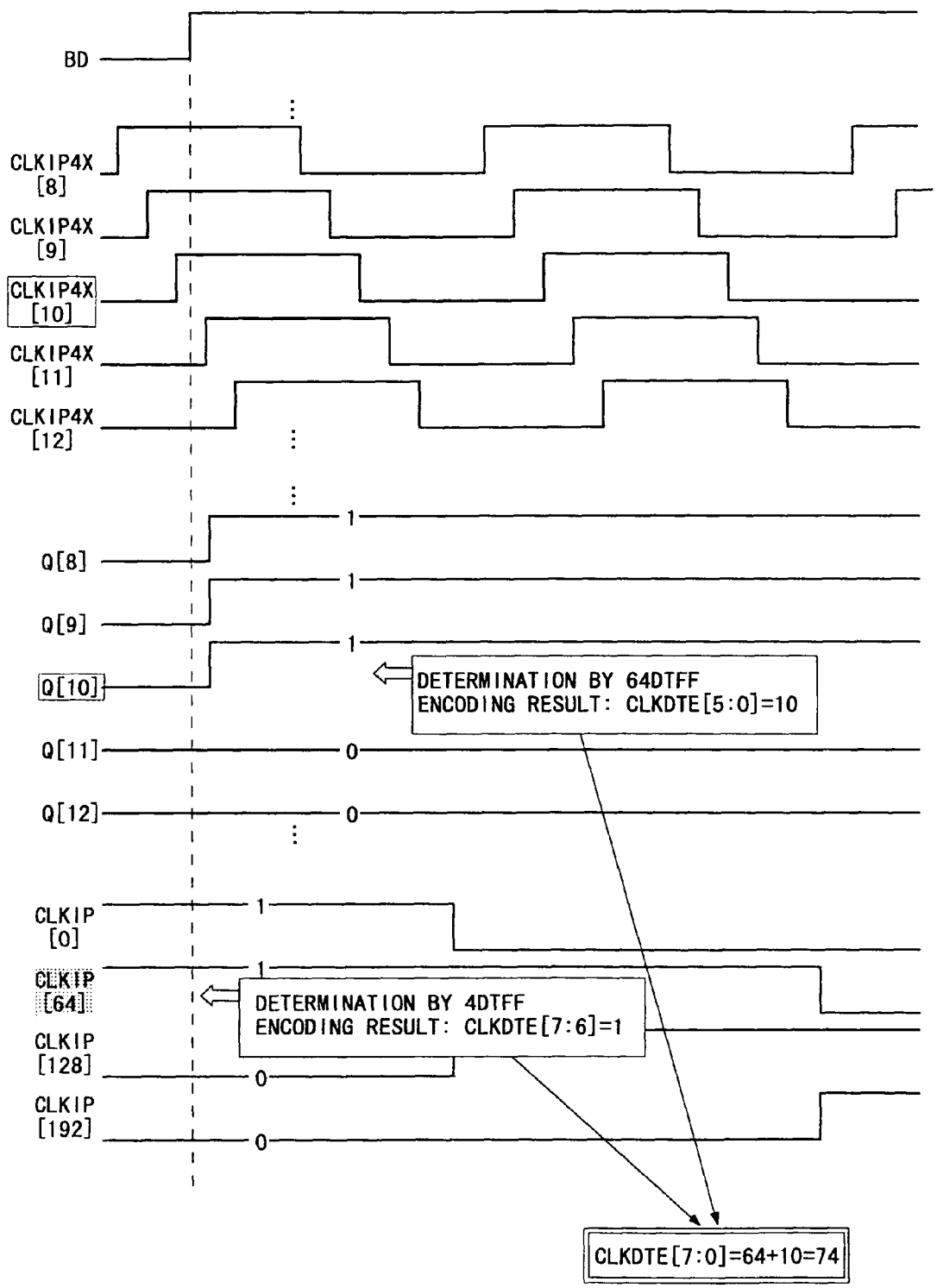
FIG. 5 shows an example of a timing diagram according to the first exemplary embodiment of the present invention.

FIG. 5 is an example of a timing diagram showing the synchronous signal BD, part of the high-speed clock signals CLKIP4X[0] to [63], part of the output signals Q[0] to [63], and the representative clock signals CLKIP[0], CLKIP[64], CLKIP[128], and CLKIP[192]. In the timing diagram example, at a rising edge of the synchronous signal BD, the input value of each of the representative clock signals CLKIP [0] and CLKIP[64] is "1", and the input value of each of the representative clock signals CLKIP[128] and [192] is "0". It can be determined from the results that the representative clock signal CLKIP[64] is synchronized with the synchronous signal BD.

Based on the determination result, i.e., based on the result that the synchronous signal BD is synchronized with the representative clock signal CLKIP[64], it is determined that the high-speed clock signal CLKIP4X[10] synchronized with the synchronous signal BD belongs to the high-speed multiphase clock signals CLKIP4X[63:0] of the second cycle. As a result, the low-speed clock signal synchronized with the synchronous signal BD can be specified, from the expression 64+10=74, as the clock signal CLKIP[74].

Referring to FIG. 3B, the 64-to-6 encoder 53 generates a 6-bit high-speed clock specifying signal CLKDTE[5:0] using a 64-bit output value Q[63:0], which is obtained from the 64DTFF 51, as an input value.

The 4-to-2 encoder 54 generates a 2-bit representative clock specifying signal CLKDTE[7:6] using a 4-bit output value Q2[3:0], which is obtained from the 4DTFF 52, as an input value.

The high-speed clock specifying signal CLKDTE[5:0] and the representative clock specifying signal CLKDTE[7:6] are used to generate an 8-bit synchronous position signal CLKDTE[7:0]. The synchronous position signal CLKDTE [7:0] serves as data indicating the low-speed multiphase clock signal synchronized with the synchronous signal BD.

As described above, the synchronization detection circuit 2 of this exemplary embodiment is capable of specifying the clock signal synchronized with the synchronous signal from among the 256-phase low-speed multiphase clock signals based on the comparison result between the synchronous signal and the 64-phase high-speed multiphase clock signals and the comparison result between the synchronous signal and the four-phase representative clock signals. In other words, in this exemplary embodiment, one phase can be specified from among the 256 phases by using 68 comparison means (FF circuits), which results in a drastic reduction in the number of components, installation area, costs, and the like. Further, the use of high-speed multiphase clock signals having a high resolution enables the detection with high accuracy. Furthermore, in this exemplary embodiment, the representative clock signals, which are selected from the low-speed multiphase clock signals and have a small number of phases, are used to specify the cycle of each of the high-speed multiphase clock signals, and thus the processing speed is hardly lowered.

Second Exemplary Embodiment

Figure 6:
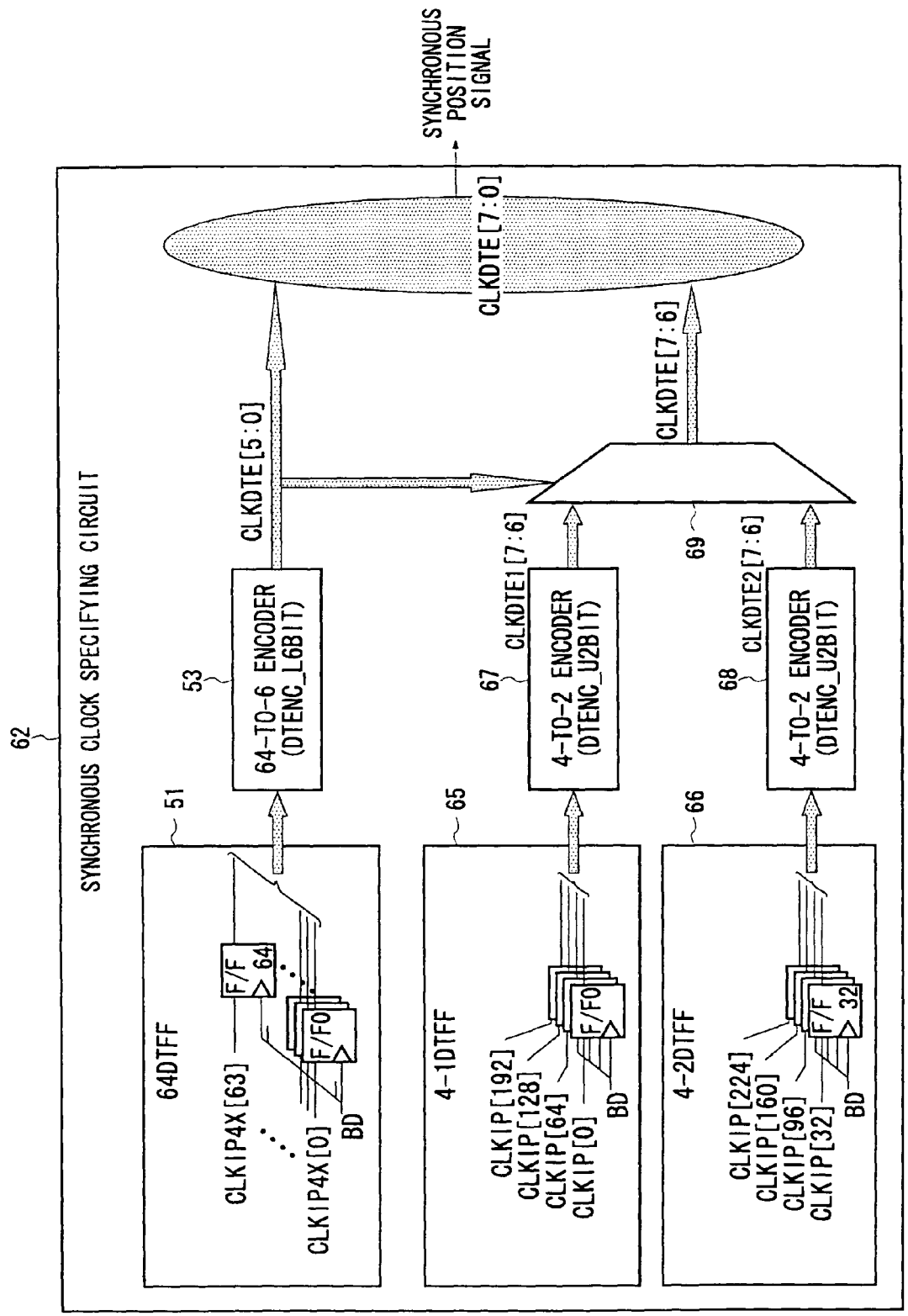
FIG. 6 is a diagram showing the configuration of a synchronous clock specifying circuit according to a second exemplary embodiment of the present invention.

FIG. 6 is a block diagram showing the configuration of a synchronous clock specifying circuit 62 according to a second exemplary embodiment of the present invention. The synchronous clock specifying circuit 62 includes two DTFFs, i.e., a 4-1DTFF 65 and a 4-2DTFF 66, each of which corresponds to the 4DTFF 52 of the first exemplary embodiment. Further, the synchronous clock specifying circuit 62 includes two encoders, i.e., a first 4-to-2 encoder 67 and a second 4-to-2encoder 68, each of which corresponds to the 4-to-2 encoder 54 of the first exemplary embodiment. Furthermore, the synchronous clock specifying circuit 62 includes a multiplexer 69 that selectively outputs the output values of the first and second 4-to-2 encoders 67 and 68.

The 4-1DTFF 65 has the same configuration and operations as those of the 4DTFF 52 of the first exemplary embodiment, and receives the representative clock signals CLKIP[0], CLKIP[64], CLKIP[128], and CLKIP[192] in the same manner as in the first exemplary embodiment. Specifically, each of the representative clock signals CLKIP[0], CLKIP[64], CLKIP[128], and CLKIP[192] is compared with the synchronous signal BD, and the comparison result is output as a 4-bit signal.

The 4-2DTFF 66 has the same configuration and operations as those of each of the 4-1DTFF 65 and the 4DTFF 52, and receive input representative clock signals that are different from those of the first exemplary embodiment. The 4-2DTFF 66 receives the representative clock signals CLKIP[32], CLKIP[96], CLKIP[160], and CLKIP[224], and outputs the comparison result between each of the representative clock signals and the synchronous signal BD as a 4-bit signal.

The first 4-to-2 encoder 67 converts the 4-bit output value of the 4-1DTFF 65 into a 2-bit first representative clock specifying signal CLKDTE1[7:6].

The second 4-to-2 encoder 68 converts the 4-bit output value of the 4-2DTFF 66 into a 2-bit second representative clock specifying signal CLKDTE2[7:6].

The multiplexer 69 receives the first representative clock specifying signal CLKDTE1[7:6], the second representative clock specifying signal CLKDTE2[7:6], and the high-speed clock specifying signal CLKDTE[5:0] generated by the 64-to-6 encoder 53. Then, the multiplexer 69 selects one of the first and second representative clock specifying signals based on the high-speed clock specifying signal CLKDTE[5:0], and outputs the selected signal as a 2-bit representative clock specifying signal CLKDTE[7:6].

Further, the representative clock specifying signal CLKDTE[7:6] selected by the multiplexer 69 and the high-speed clock specifying signal CLKDTE[5:0] are used to generate the 8-bit synchronous position signal CLKDTE[7:0].

Figure 7:
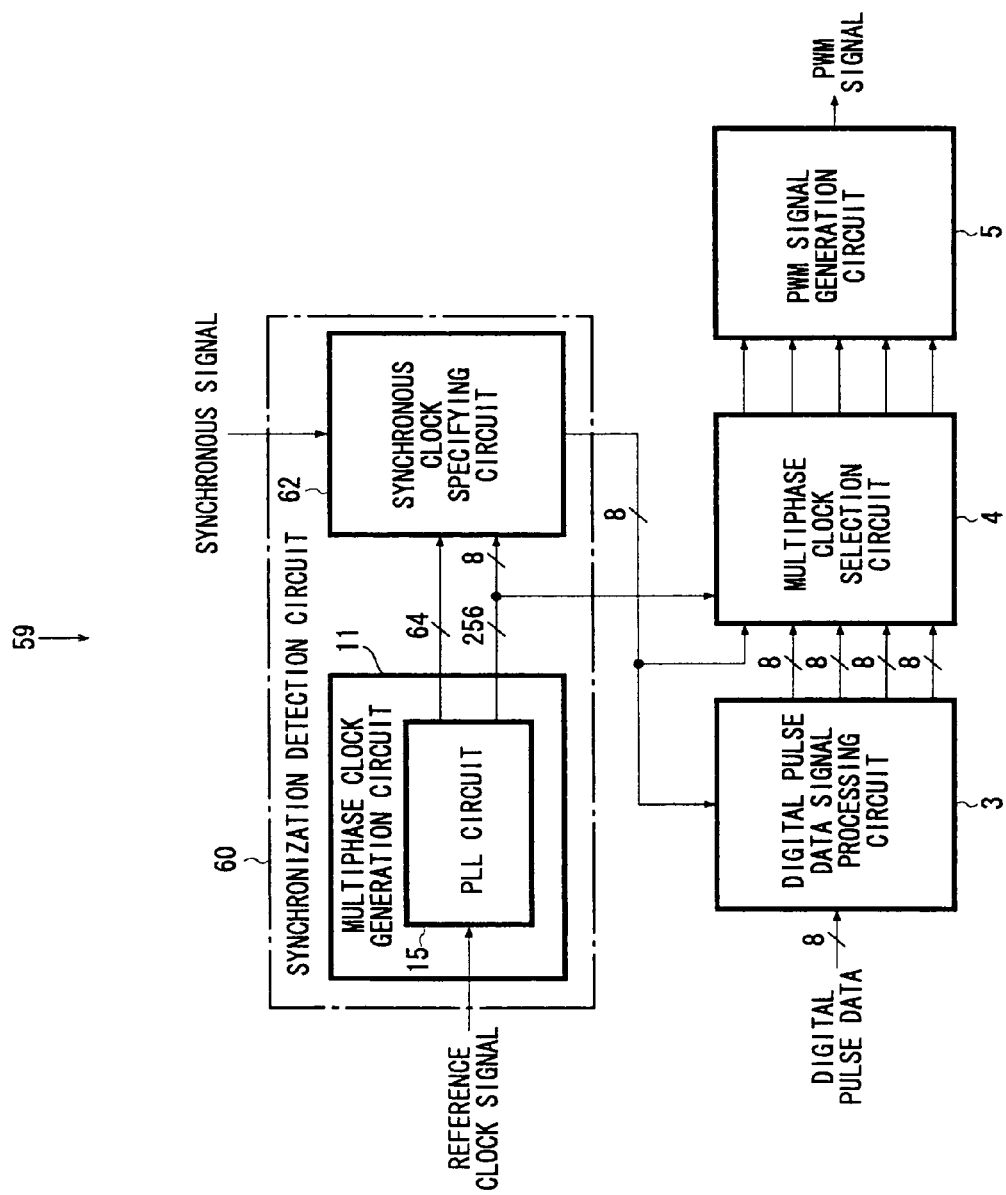
FIG. 7 is a diagram showing the configuration of a pulse width modulation circuit according to the second exemplary embodiment of the present invention.

Referring to FIG. 7, in a pulse width modulation circuit 59 of this exemplary embodiment which includes the synchronous clock specifying circuit 62 having the above-mentioned configuration, eight-phase representative clock signals are selected from the 256-phase low-speed multiphase clock signals generated by the multiphase clock generation circuit 11, and are input to the synchronous clock specifying circuit 62.

The representative clock signals CLKIP[32], CLKIP[96], CLKIP[160], and CLKIP[224], which are input to the 4-2DTFF 66, are intermediate between the representative clock signals CLKIP[0], CLKIP[64], CLKIP[128], and CLKIP[192] that are input to the 4-1DTFF 65.

The multiplexer 69 outputs the second representative clock specifying signal CLKDTE2[7:6] as the representative clock specifying signal CLKDTE[7:6] when the high-speed clock specifying signal CLKDTE[5:0] ranges from 0 to 15 or from 48 to 63, i.e., when the synchronous position of the synchronous signal BD is closer to the CLKIP4X[0] group (i.e., the first representative clock signals CLKIP[0], CLKIP[64], CLKIP[128], and CLKIP[192]) than the CLKIP4X[32] group (i.e., the second representative clock signals CLKIP[32], CLKIP[96], CLKIP[160], and CLKIP[224]). Meanwhile, when the high-speed clock specifying signal CLKDTE[5:0] ranges from 16 to 47, the first representative clock specifying signal CLKDTE1[7:6] is output as the representative clock specifying signal CLKDTE[7:6].

Figure 8:
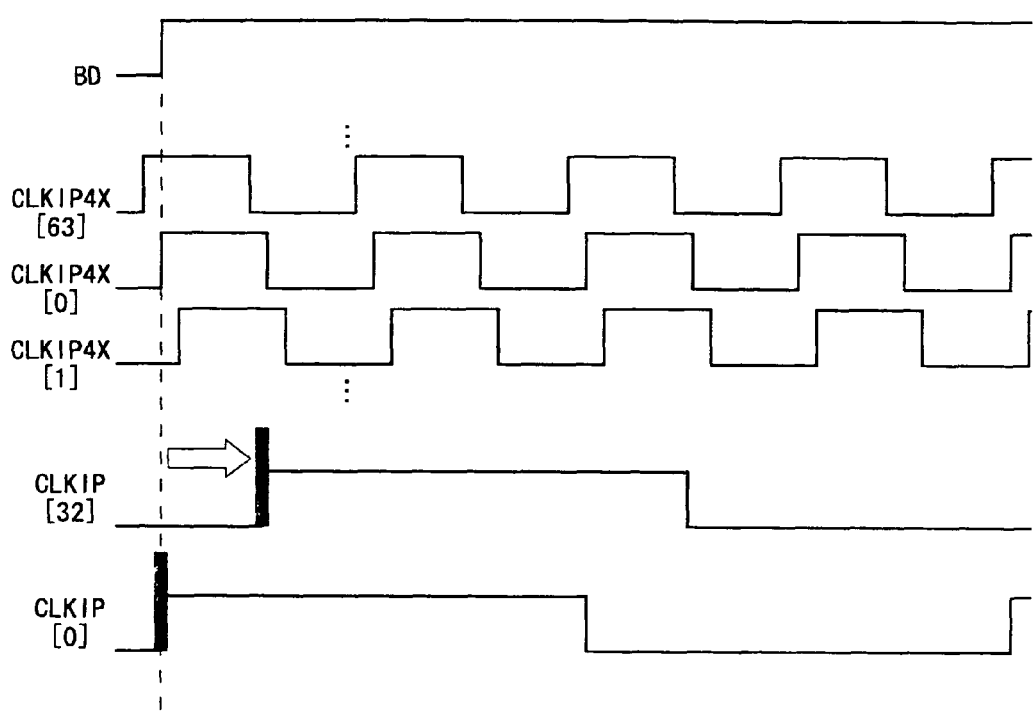
FIG. 8 shows an example of a timing diagram of the second exemplary embodiment of the present invention.

FIG. 8 is an example of a timing diagram showing the synchronous signal BD, part of the high-speed multiphase clock signals CLKIP4X[63:0], and part of the representative clock signals CLKIP[0], [43]. In this example, the synchronous signal BD is synchronized with the high-speed clock signal CLKIP4X[0]. In this case, when a group of signals containing the CLKIP[0] (i.e., CLKIP[0], CLKIP[64], CLKIP[128], and CLKIP[192]) is used as the representative clock signal, a sufficient setup time or hold time may not be secured. Thus, a group of signals containing the CLKIP[32] (i.e., CLKIP[32], CLKIP[96], CLKIP[160], and CLKIP[224]) is used.

As described above, when the representative clock signals are close to the synchronous position of the synchronous signal BD, a setup/hold violation may occur. Thus, in the manner as described above, the multiplexer 69 selects the comparison result indicating the representative clock signals containing a clock signal that is farther from the synchronous position of the synchronous signal BD, thereby preventing the setup/hold violation in the 4-1DTFF 65 or 4-2DTFF 66. As a result, the synchronization detection can be performed with higher accuracy than the first exemplary embodiment.

Third Exemplary Embodiment

Figure 9A:
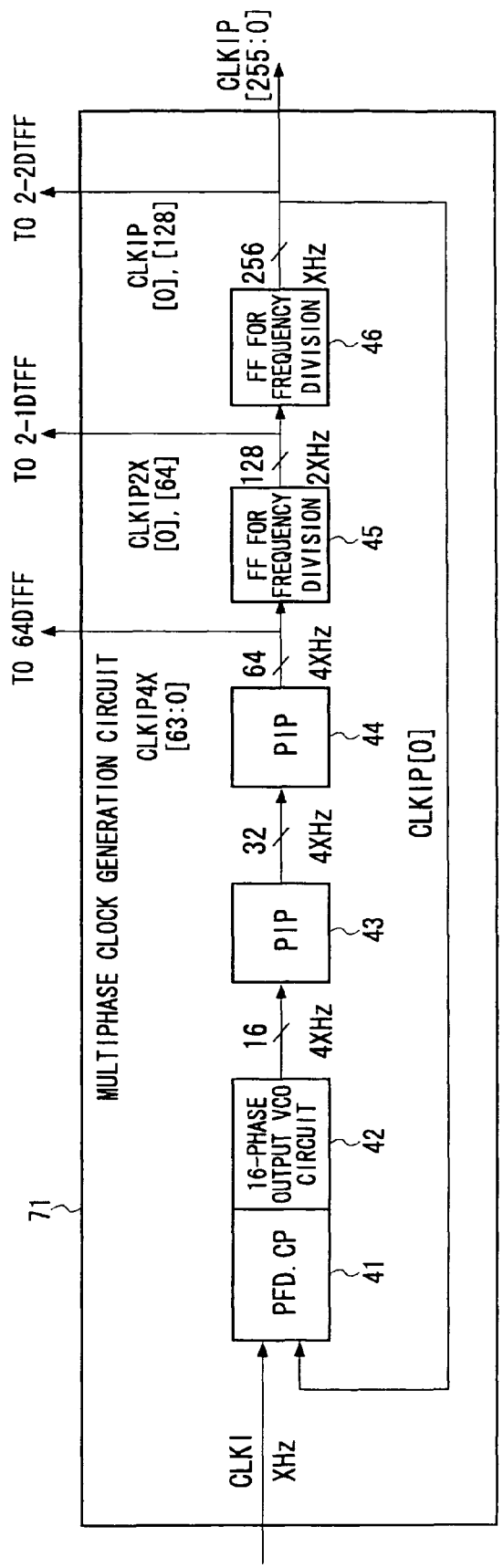
FIG. 9A is a diagram showing the configuration of a multiphase clock generation circuit according to a third exemplary embodiment of the present invention.
Figure 9B:
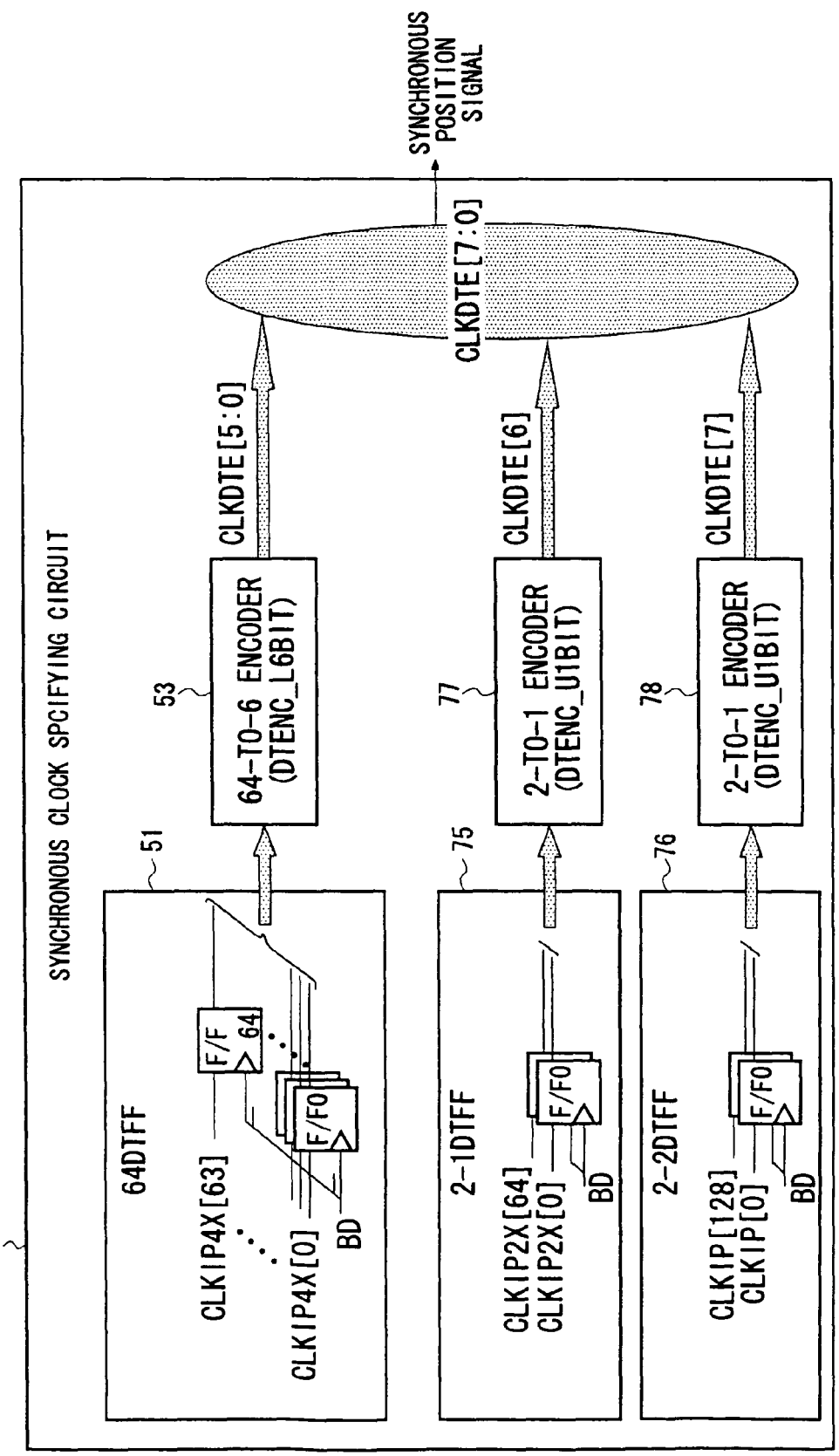
FIG. 9B is a diagram showing the configuration of a synchronous clock specifying circuit according to the third exemplary embodiment of the present invention.

FIG. 9A is a block diagram showing the configuration of a multiphase clock generation circuit 71 according to a third exemplary embodiment of the present invention. FIG. 9B is a block diagram showing the configuration of a synchronous clock specifying circuit 72 according to the third exemplary embodiment.

The multiphase clock generation circuit 71 has the same configuration as that of the first and second exemplary embodiments, but differs from the first and second exemplary embodiments in the method of selecting the representative clock signals. In this exemplary embodiment, two third representative clock signals CLKIP2X[0] and [64] are selected from low-speed multiphase clock signals CLKIP2X[127:0] which are output from the first frequency divider 45 and the frequency of which is divided by two. Further, two fourth representative clock signals CLKIP[0] and [128] are selected from low-speed multiphase clock signals CLKIP[256:0] which are output from the second frequency divider 46 and the frequency of which is further divided by two.

The synchronous clock specifying circuit 72 includes two DTFFs, i.e., a 2-1DTFF 75 and a 2-2DTFF 76, each of which corresponds to the 4DTFF 52 of the first exemplary embodiment. The synchronous clock specifying circuit 72 further includes two encoders, i.e., a third 2-to-1 encoder 77 and a fourth 2-to-1. encoder 78, each of which corresponds to the 4-to-2. encoder 54 of the first exemplary embodiment.

The 2-1DTFF 75 compares the synchronous signal BD with the third representative clock signals CLKIP2X[0] and [64], and outputs the comparison result as a 2-bit signal.

The 2-2DTFF 76 compares the synchronous signal BD with the fourth representative clock signals CLKIP[0] and [126], and outputs the comparison result as a 2-bit signal.

The third 2-to-1 encoder 77 converts the 2-bit output value of the 2-1DTFF 75 into a 1-bit third representative clock specifying signal CLKDTE[6].

The fourth 2-to-1 encoder 78 converts the 2-bit output value of the 2-2DTFF 76 into a 1-bit fourth representative clock specifying signal CLKDTE[7].

Then, the high-speed clock specifying signal CLKDTE[5:0], the third representative clock specifying signal CLKDTE[6], and the fourth representative clock specifying signal CLKDTE[7] are used to generate the 8-bit synchronous position signal CLKDTE[7:0].

Figure 10:
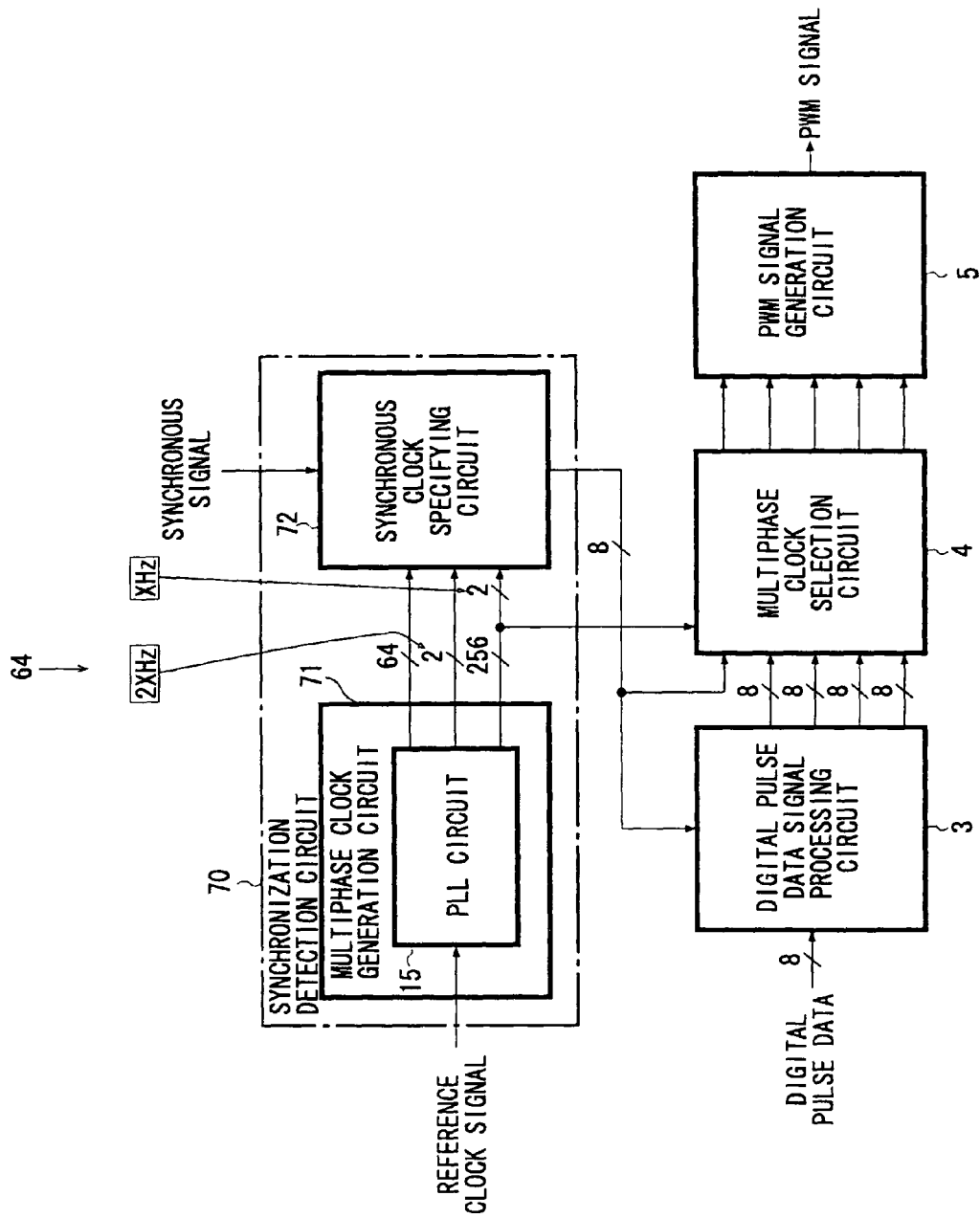
FIG. 10 is a diagram showing the configuration of a pulse width modulation circuit according to the third exemplary embodiment of the present invention.

Referring to FIG. 10, in a pulse width modulation circuit 64 of this exemplary embodiment which includes the synchronous clock specifying circuit 72 having the above-mentioned configuration, the two-phase third representative clock signals CLKIP2X[0] and [64] are selected from the low-speed multiphase clock signals CLKIP2X[127:0] generated by the multiphase clock generation circuit 71. Further, the two-phase fourth representative clock signals CLKIP[0] and [128] are selected from the low-speed multiphase clock signals CLKIP[255:0]. These selected signals are input to the synchronous clock specifying circuit 72.

As described above, in this exemplary embodiment, clock signals having different frequencies are used as the representative clock signals. Also in this configuration, the cycle of the high-speed multiphase clock signal can be specified to detect the synchronous position of the synchronous signal BD with high accuracy, as in the case of the first exemplary embodiment. Thus, the representative clock signals can be selected using various methods according to an exemplary embodiment of the present invention.

Fourth Exemplary Embodiment

Figure 11:
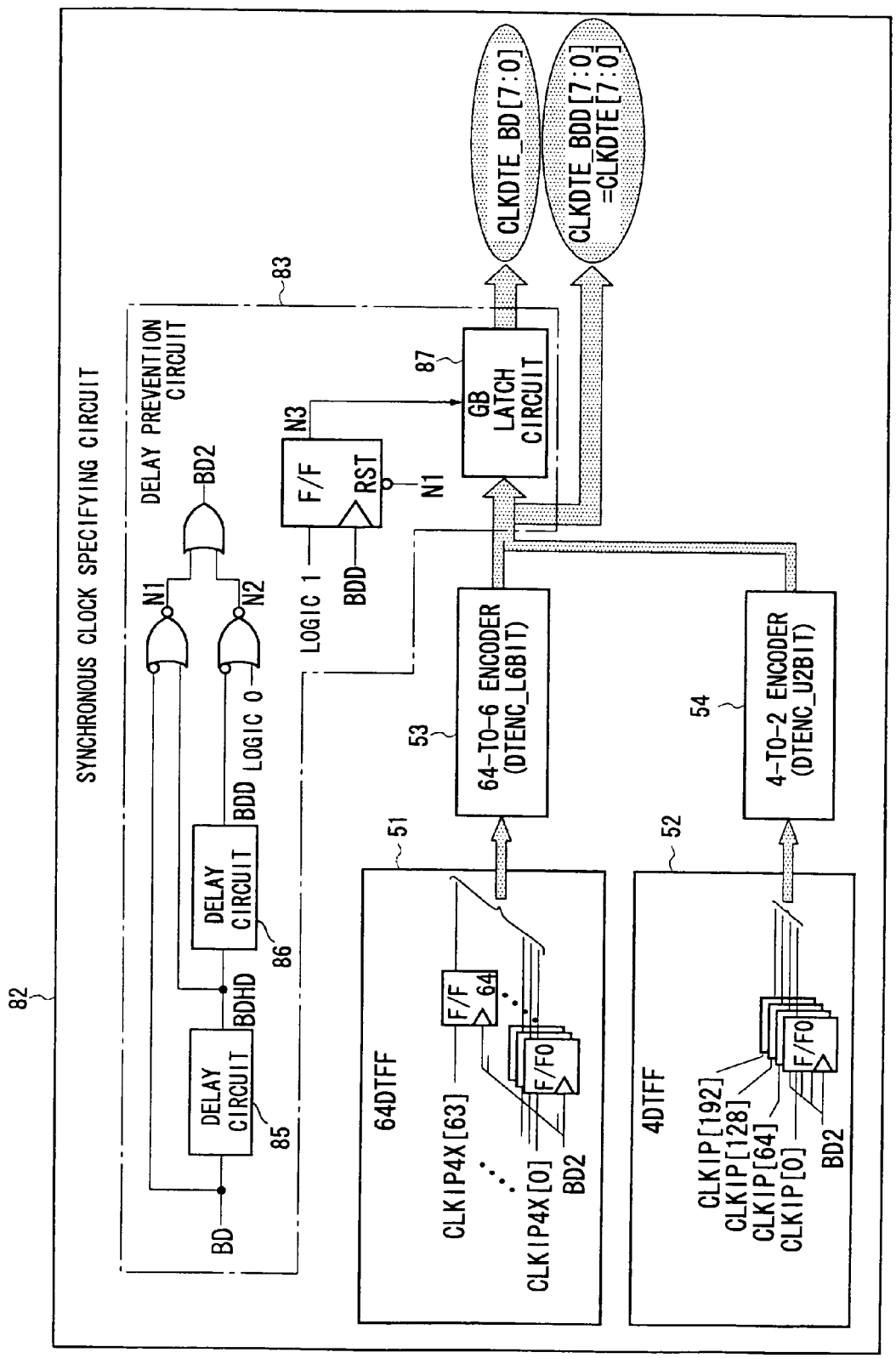
FIG. 11 is a diagram showing the configuration of a synchronous clock specifying circuit according to a fourth exemplary embodiment of the present invention.
Figure 12:
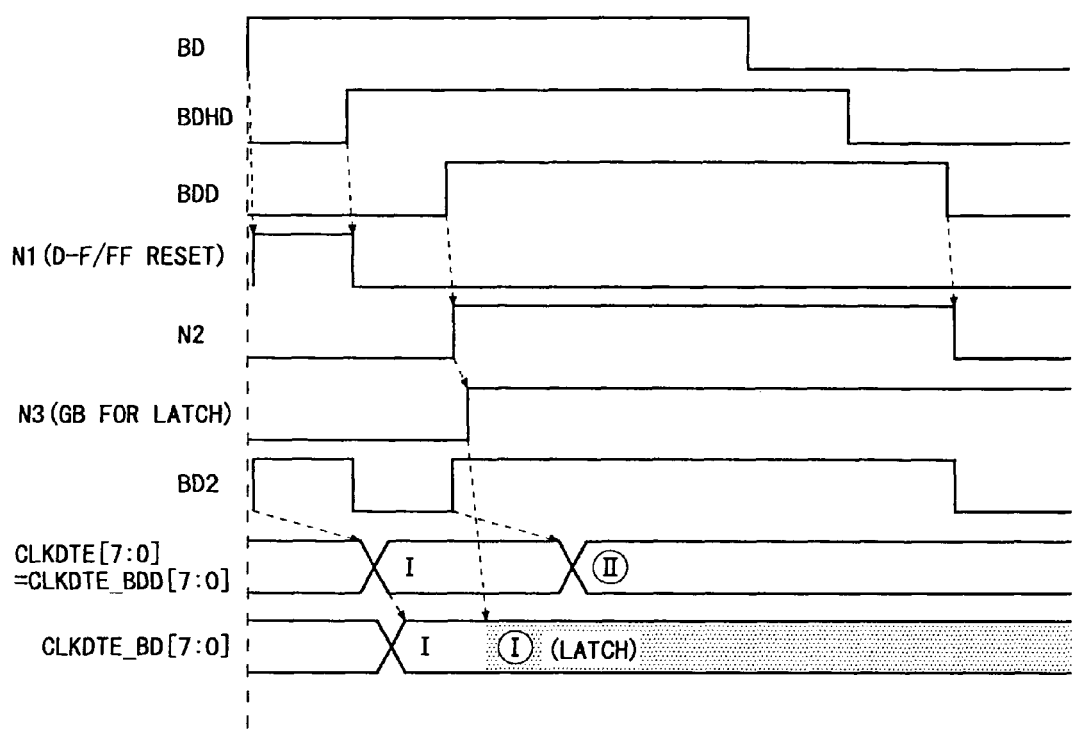
FIG. 12 shows an example of a timing diagram of the fourth exemplary embodiment of the present invention.

FIG. 11 is a block diagram showing the configuration of a synchronous clock specifying circuit 82 according to a fourth exemplary embodiment of the present invention. The synchronous clock specifying circuit 82 includes a delay prevention circuit 83 in addition to the configuration of the synchronous clock specifying circuit according to the first exemplary embodiment. Further, FIG. 12 is an example of a timing diagram showing the synchronous clock specifying circuit 82 of this exemplary embodiment.

The delay prevention circuit 83 generates a delay synchronous signal BDD by causing first and second delay circuits 85 and 86 to delay the synchronous signal BD by a time corresponding to a delay from the input of the synchronous signal BD to the output of the PWM signal (see FIG. 1), and generates a composite synchronous signal BD2. having both pulse edges of the synchronous signal BD and the delay synchronous signal BDD. A falling edge of the composite synchronous signal BD2 is generated so as to correspond to a rising edge of an intermediate delay synchronous signal BDHD generated by the first delay circuit 85.

The composite synchronous signal BD2 is input to each of the 64DTFF 51 and the 4DTFF 52. Then, the 64DTFF 51 and the 4DTFF 52 operate at each rising edge of the composite synchronous signal BD2. As a result, each of the 64-to-6 encoder 53 and the 4-to-2 encoder 54 generates a signal corresponding to the synchronous signal BD and a signal corresponding to the delay synchronous signal BDD.

Specifically, the 64-to-6 encoder 53 generates a first high-speed clock specifying signal CLKDTE_BD[5:0] corresponding to the synchronous signal BD and a second high-speed clock specifying signal CLKDTE_BDD[5:0] corresponding to the delay synchronous signal BDD. Further, the 4-to-2 encoder 54 generates a first representative clock specifying signal CLKDTE_BD[7:6] corresponding to the synchronous signal BD and a second representative clock specifying signal CLKDTE_BDD[7:6] corresponding to the delay synchronous signal BDD.

The first high-speed clock specifying signal CLKDTE_BD[5:0] and the first representative clock specifying signal CLKDTE_BD[7:6] are used to generate a first synchronous position signal CLKDTE_BD[7:0]. Further, the second high-speed clock specifying signal CLKDTE_BDD[5:0] and the second representative clock specifying signal CLKDTE_BDD[7:6] are used to generate a second synchronous position signal CLKDTE_BDD[7:0].

At the first rising edge of the composite synchronous signal BD2, the first synchronous position signal CLKDTE_BD[7:0] corresponding to the synchronous signal BD is generated and then held in a latch circuit 87. During the operation of the 64DTFF 51 and the 4DTFF 52 at the second rising edge of the composite synchronous signal BD2, a signal is input to an input GB of the latch circuit 87, and the first synchronous position signal CLKDTE_BD[7:0] is held therein. Then, the second synchronous position signal CLKDTE_BDD[7:0] is generated through the operation of the 64DTFF 51 and the 4DTFF 52.

The difference between the pulse edges of the second synchronous position signal CLKDTE_BDD[7:0] and the first synchronous position signal CLKDTE BD[7:0] serves as data corresponding to a delay from the input of the synchronous signal BD to the output of the PWM signal. Accordingly, the operation performed by the digital pulse data signal processing circuit 3 in consideration of the data makes it possible to cancel the delay caused in each of the multiphase clock generation circuit 11 and the PWM generation circuit 5.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first and second exemplary embodiments can be combined as desirable by one of ordinary skill in the art.

What is claimed is:

1. A synchronization detection circuit comprising:
a multiphase clock generation circuit which comprises a phase locked loop circuit that generates multiphase clock signals having a plurality of different phases, based on a reference clock signal, and which generates high-speed multiphase clock signals having a frequency obtained by multiplying a frequency of the reference clock signal, and low-speed multiphase clock signals having a frequency obtained by dividing a frequency of the high-speed multiphase clock signals; and a synchronous clock specifying circuit that specifies a clock signal synchronized with a synchronous signal from among the multiphase clock signals, and generates a synchronous position signal indicating a synchronous position of the synchronous signal, based on a comparison result between the synchronous signal and the high-speed multiphase clock signals and a comparison result between the synchronous signal and representative clock signals selected from the low-speed multiphase clock signals.

2. The synchronization detection circuit according to claim 1, wherein the phase locked loop circuit comprises:

a multiplier circuit that performs multiplication processing on clock signals;

a phase interpolation circuit that performs phase interpolation on clock signals; and a frequency dividing circuit that performs frequency division processing on clock signals.

3. The synchronization detection circuit according to claim 1, wherein the synchronous clock specifying circuit comprises:

a high-speed clock comparator that compares a pulse edge of the synchronous signal with a pulse edge of the high-speed multiphase clock signals;

a representative clock comparator that compares a pulse edge of the synchronous signal with a pulse edge of the representative clock signals;

a high-speed clock encoder that generates a high-speed clock specifying signal for specifying a clock signal synchronized with the synchronous signal from among the high-speed multiphase clock signals, based on a comparison result from the high-speed clock comparator;

a representative clock signal encoder that generates a representative clock specifying signal for specifying a clock signal corresponding to the synchronous signal from among the representative clock signals, based on a comparison result from the representative clock comparator; and a synchronous position signal generation circuit that generates the synchronous position signal based on the high-speed clock specifying signal and the representative clock specifying signal.

4. The synchronization detection circuit according to claim 1, further comprising a delay prevention circuit that generates a delay synchronous signal in consideration of a predetermined delay with respect to the synchronous signal, and a delay synchronous position signal indicating a synchronous position of the delay synchronous signal, and holds the synchronous position signal and the delay synchronous position signal.

5. The synchronization detection circuit according to claim 4, wherein the delay prevention circuit generates a delay composite synchronous signal having two pulse edges of the synchronous signal and the delay synchronous signal, and the synchronous clock specifying circuit compares the delay composite synchronous signal with the multiphase clock signals.

6. A pulse width modulation circuit which comprises a synchronization detection circuit according to claim 1, and which outputs a pulse width modulation signal based on multiphase clock signals generated by the multiphase clock generation circuit, a synchronous position signal generated by the synchronous clock specifying circuit, and digital pulse data.

7. The pulse width modulation circuit according to claim 6, wherein the multiphase clock signals correspond to the low-speed multiphase clock signals.

8. A synchronization detection method comprising:

generating high-speed multiphase clock signals synchronized in phase with a reference clock signal, having a frequency obtained by multiplying a frequency of the reference clock signal, and having a plurality of different phases;

generating low-speed multiphase clock signals synchronized in phase with the reference clock signal, having a frequency obtained by dividing a frequency of the high-speed multiphase clock signals, and having a plurality of different phases;

selecting a representative clock signal capable of specifying a cycle of each of the high-speed multiphase clock signals from among the low-speed multiphase clock signals;

comparing a synchronous signal with the high-speed multiphase clock signals;

comparing the synchronous signal with the representative clock signal; and generating a synchronous position signal for specifying a synchronous position of the synchronous signal based on a comparison result between the synchronous signal and the high-speed multiphase clock signals and a comparison result between the synchronous signal and the representative clock signal.

* * * * *